(12) United States Patent
Scott et al.

(10) Patent No.: US 6,620,692 B2
(45) Date of Patent: Sep. 16, 2003

(54) METHOD OF FORMING A METAL OXIDE SEMICONDUCTOR TRANSISTOR WITH SELF-ALIGNED CHANNEL IMPLANT

(75) Inventors: David B. Scott, Plano, TX (US); Dan M. Mosher, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/133,556

(22) Filed: Apr. 26, 2002

(65) Prior Publication Data
US 2003/0102492 A1 Jun. 5, 2003

Related U.S. Application Data

(62) Division of application No. 09/998,615, filed on Nov. 30, 2001.

(51) Int. Cl.$^7$ ............................................. H01L 21/336
(52) U.S. Cl. .................... 438/270; 438/257; 438/525; 438/692
(58) Field of Search .................. 364/551.01; 438/270, 438/692, 705, 752, 257, 525

(56) References Cited

U.S. PATENT DOCUMENTS

| | | | |
|---|---|---|---|
| 4,093,503 A | * | 6/1978 | Harris et al. ............. 216/3 |
| 4,532,698 A | * | 8/1985 | Fang et al. ............. 438/286 |
| 5,316,961 A | * | 5/1994 | Okazawa |
| 5,642,295 A | * | 6/1997 | Smayling |
| 6,261,964 B1 | * | 7/2001 | Wu et al. ............. 438/705 |
| 6,268,640 B1 | * | 7/2001 | Park et al. |
| 6,444,548 B2 | * | 9/2002 | Divakaruni et al. |

* cited by examiner

*Primary Examiner*—David Nelms
*Assistant Examiner*—Dao H. Nguyen
(74) *Attorney, Agent, or Firm*—Peter K. McLarty; W. James Brady III; Frederick J. Telecky, Jr.

(57) ABSTRACT

A transistor (50) comprising a gate conductor (68) and a gate insulator (66) separating the gate conductor from a semiconductor material (64) having a first conductivity type. The transistor further comprises a drain region (78$_2$) having the first conductivity type. The transistor further comprises an angular implanted region (70) having a second conductivity type complementary of the first conductivity type and having an angular implanted region edge (70a) underlying the gate conductor, and the transistor includes a source region (78$_1$) formed at least in part within the angular implanted region. Finally, a transistor channel (74) is defined between an edge (71a) of the source region proximate the gate conductor and the angular implanted region edge (70a) underlying the gate conductor.

7 Claims, 3 Drawing Sheets

METHOD OF FORMING A METAL OXIDE SEMICONDUCTOR TRANSISTOR WITH SELF-ALIGNED CHANNEL IMPLANT

This application is a divisional of application Ser. No. 09/998,615, filed Nov. 30, 2001.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to metal oxide semiconductor ("MOS") transistors and are more particularly directed to such a transistor with a self-aligned channel implant.

Electronic circuit design is often critically affected by the design of individual transistors used within a circuit. As a result, transistor design has developed for years and continues to be an area of extensive research for various issues, including uniformity of operation between multiple transistors constructed according to a same design as well as device reliability. In this regard, MOS field effect transistor ("MOSFET") design typically specifies parameters and methods relating to the formation of various components relative to a semiconductor substrate, including the creation of doped regions within the substrate. Consequently, these parameters and methods affect aspects such as operational uniformity and reliability.

One aspect of a MOSFET where the above considerations is implicated is in the formation of the transistor channel, which as known in the art is the area in which a current may be induced to flow between the source and drain of the transistor. The locations of the regions that define the channel, as well as the length of the channel, may affect operational uniformity and reliability as well as other aspects relating to the transistor. Channel length may be an issue in various transistors, including one type of known MOSFET referred to in the art as a drain extended MOS ("DEMOS") transistor. A DEMOS transistor is detailed later but is also introduced here by way of background. A DEMOS transistor is named due to having a drain region formed from two regions, a first region having a doping level comparable to that of the transistor source and a second region having a reduced doping level and which extends under the transistor gate. DEMOS transistors are used in various circuits, where one instance is a circuit that has different operating voltages such as where a first voltage is used at the input/output level while a second and lower voltage is used for the operational core of the circuit. In these cases, transistors suitable for use at the higher input/output voltages are required, and one type of such a transistor is the DEMOS transistor. DEMOS transistors also may be used in applications where the voltage on the drain exceeds the normal voltage rating of the gate oxide.

Given the preceding, it has been observed by the present inventors that for the DEMOS transistor, and possibly for other MOSFETs, some approaches in the art form regions that define the transistor channel prior to the formation of the transistor gate. For example, for the DEMOS transistor the channel may be defined relative to an insulating region which generally defines the transistor active region. However, often such designs leave room for variation in the channel length as well as the actual formation of the channel, where both aspects may be affected by the later-formed transistor gate. Consequently, these variations may affect device uniformity and reliability. The preferred embodiments seek to improve upon these drawbacks, as further explored below.

BRIEF SUMMARY OF THE INVENTION

In the preferred embodiment, there is a transistor. The transistor comprises a gate conductor and a gate insulator separating the gate conductor from a semiconductor material having a first conductivity type. The transistor further comprises a drain region having the first conductivity type. The transistor further comprises an angular implanted region having a second conductivity type complementary of the first conductivity type and having an angular implanted region edge underlying the gate conductor, and the transistor includes a source region formed within the angular implanted region. Finally, a transistor channel is defined between an edge of the source region proximate the gate conductor and the angular implanted region edge underlying the gate conductor. Other aspects are also disclosed and claimed.

DETAILED DESCRIPTION OF THE INVENTION

Figure 1A:
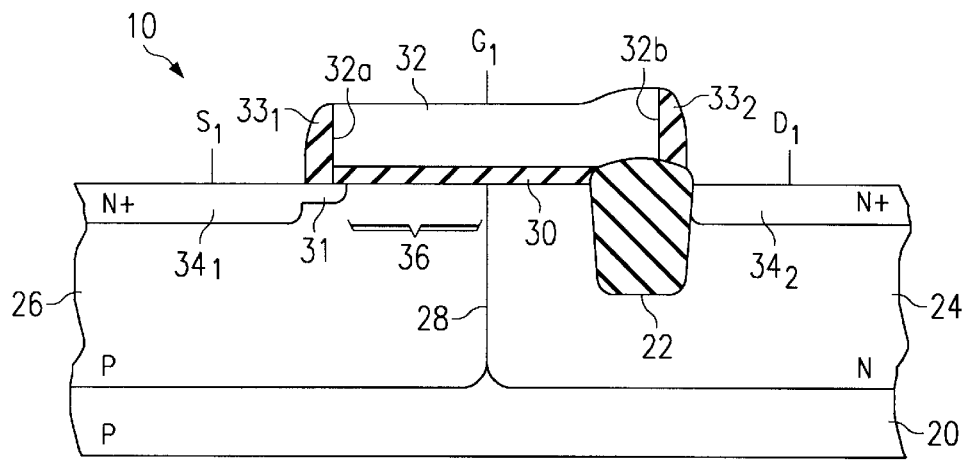
FIG. 1a illustrates a cross-sectional view of a prior art DEMOS transistor 10.

By way of additional introduction to the prior art beyond that discussed in the earlier Background Of The Invention section of this document, FIG. 1a illustrates a cross-sectional view of a prior art DEMOS transistor 10. To present a more thorough appreciation of DEMOS transistor 10, the following discussion first introduces its various components while a later discussion elaborates on the method and order in which various of those components are formed.

Transistor 10 is formed relative to a substrate 20 which, in the example of FIG. 1a, is formed from a p-type semiconductor material. A shallow trench isolation ("STI") region 22 is formed in substrate 20 and may be various insulating materials such as silicon oxide or silicon nitride. Two well regions 24 and 26 of opposite conductivity types are formed in substrate 20 and with an interface 28 between the two. In the example of FIG. 1a well 24 is an n-type well and well 26 is a p-type well and, thus, are labeled generally with an N and P, respectively. A gate dielectric 30 is formed over substrate 20, and a gate conductor 32 is formed over gate dielectric 30 and extends partially over STI region 22. For the sake of reference, gate conductor 32 is also shown by a schematic indication in FIG. 1a with the identifier "$G_1$." A lightly doped region 31 is formed self-aligned to edge 32a of gate conductor 32, such as by implanting n-type dopants in the area of edge 32a and where those dopants diffuse slightly under gate conductor 32 and gate dielectric 30. Thereafter, sidewall insulators $33_1$ and $33_2$ are formed along edges 32a and 32b, respectively of gate conductor 32. Two doped regions $34_1$ and $34_2$ are formed within substrate 20 and are self-aligned to sidewall insulators $33_1$ and $33_2$ (and, hence, also to gate conductor 32). In the present example, regions $34_1$ and $34_2$ are n-type regions with relatively high doping concentrations (e.g., relative to n-well 24) and are, therefore, labeled in FIG. 1a with an N+ designation. Generally, region $34_1$ combines with the previously-formed lightly doped region 31 and the combination is considered to provide the source of transistor 10 and is schematically labeled "$S_1$", and region $34_2$ is considered to provide in part the drain of transistor 10 and is schematically labeled "$D_1$." Note that region $34_2$ as an n-type region functions only as part of the drain of transistor 10 in that the like-conductivity type n-well 24 effectively extends the drain region under gate conductor 32. Accordingly, a transistor channel 36 is defined under gate conductor 32 and extending between the left edge of n-well 24 and the right edge of the source region $S_1$ which includes regions $34_1$ and 31. Lastly, note that other components may be added to transistor 10 (e.g., body contact, sidewall insulators, and so forth), although such components are not shown to simplify the Figure and since they are unnecessary to further appreciate the preferred embodiments discussed later.

Figure 1B:
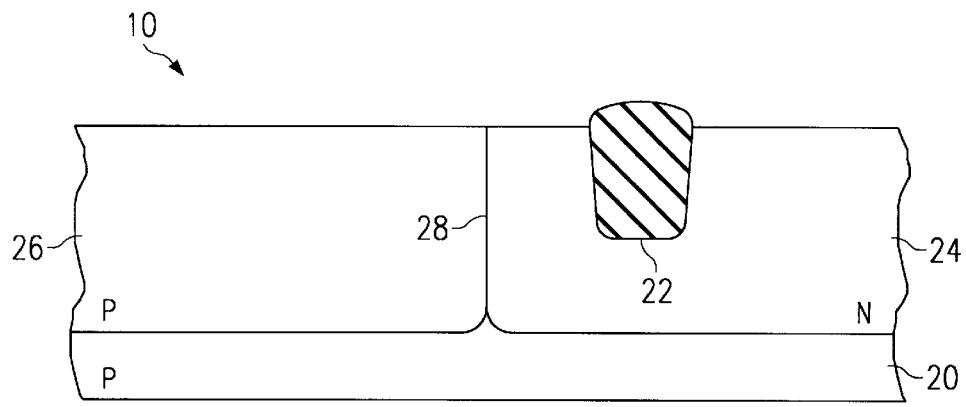
FIG. 1b illustrates a cross-sectional view of the prior art DEMOS transistor 10 from FIG. 1a after some preliminary construction steps.

Having described the various parts of transistor 10 of FIG. 1a, a further appreciation of some of those parts is facilitated by understanding certain steps of the formation of transistor 10 as is now explored with reference to FIG. 1b. Specifically, FIG. 1b illustrates a cross-sectional view of the prior art DEMOS transistor 10 from FIG. 1a after some preliminary construction steps. In FIG. 1b, STI region 22 is formed first in substrate 20, and it typically defines an adjacent area generally referred to as the active area, that is, the area in which the transistor source/drain regions will be formed. STI region 22 typically is formed by first forming a pit or void within the upper surface of substrate 20 and then filling the pit with an insulator and planarizing the insulator to leave the remaining insulator portion shown in FIG. 1b as STI region 22. After STI region 22 is formed, well regions 24 and 26 are formed in substrate 20, typically one immediately after the other, and using dopants of opposite conductivity types. Each well 24 and 26 typically is formed by masking the surface of substrate 20 and then implanting appropriate dopants through any open area of the mask; thus, in the example of FIG. 1a, well 24 is formed using n-type dopants while well 26 is formed using p-type dopants. Typically wells 24 and 26 are formed with a goal that they abut one another and thereby form the generally vertical interface 28 between the two wells. However, note that the alignment of wells 24 and 26 is established purely by a photolithographic process relative to STI region 22. In other words, typically STI region 22 has some type of marker on it that is photographically recognized by the stepper machine that fabricates transistor 10, and in response to this marker the stepper in combination with the masks used to form wells 24 and 26 thereby determine the physical distance offset of each well boundary relative to STI region 22. As a result of variations in this photolithographic alignment, note that wells 24 and 26 may not align in the intended manner.

Figure 1C:
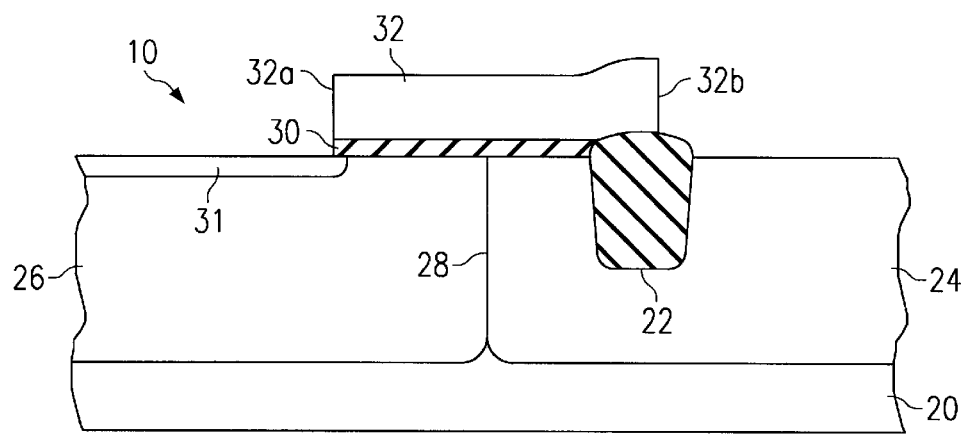
FIG. 1c illustrates a cross-sectional view of the prior art DEMOS transistor 10 from FIG. 1b after additional construction steps.

FIG. 1c illustrates a cross-sectional view of the prior art DEMOS transistor 10 from FIG. 1b after additional construction steps. Gate dielectric 30 is formed over substrate 20, and it may be an oxide, a thermally grown silicon dioxide, a nitride, an oxynitride, or a combination of these or other insulators. Gate conductor 32 is formed over gate dielectric 30 and is patterned to extend partially over STI region 22, such as by forming a layer of conductive material which is patterned and etched to form gate conductor 32. Further, gate conductor 32 is typically formed from polysilicon, although other materials may be used. In any event, because gate conductor 32 is formed after wells 24 and 26, the alignment of gate conductor 32 with respect to those wells, which by way of example may be appreciated from either edge 32a or 32b of gate conductor 32 relative to interface 28, is also subject to variations of the photolithographic process that is used to form gate conductor 32. For example, if in FIG. 1c gate conductor 32 were shifted to the left, this would increase the distance between edge 32a and interface 28 while decreasing the distance between edge 32b and interface 28. As another example, if in FIG. 1c gate conductor 32 were shifted to the right, this would decrease the distance between edge 32a and interface 28 while increasing the distance between edge 32b and interface 28. After gate conductor 32 is formed, lightly doped region 31 is formed self-aligned to edge 32a of gate conductor 32 by implanting n-type dopants in the area of edge 32a. Typically, the n-type dopants are at a lesser concentration than those used for n-type regions $34_1$, and $34_2$ (see FIG. 1a).

Concluding the details of the formation of transistor 10, attention may be returned to FIG. 1a given the previous steps illustrated from FIG. 1c. Once gate conductor 32 is formed, doped regions $34_1$ and $34_2$ are formed within substrate 20, typically by implanting the appropriate (e.g., n-type) dopants into wells 24 and 26 and then following with an annealing step. With respect to source region $34_1$, note that the portion of it adjacent channel 36 is self-aligned with respect to edge 32a of gate conductor 32, meaning edge 32a creates a physical mask and, thus, a physical reference point relative to where the edge of region $34_1$ is formed in response to the dopant implant. In addition, the subsequent anneal may cause some lateral encroachment of the dopants of region $34_1$ so that they actually extend under gate conductor 32 as shown. In any event, therefore, the edge of source region $34_1$ which defines one end of channel 36 is defined in response to a physical component self-alignment rather than a photolithographic alignment. The other edge of source region $34_1$ (not shown, but to the left in the Figure), however, may be defined by photolithographic alignment, such as in response to a mask, or in response to another STI or field oxide insulator. With respect to drain region $34_2$, its edge proximate STI region 22 is self-aligned with the edge of STI region 22 while its other edge (not shown, but to the right in the Figure) may be defined by photolithographic alignment, such as in response to a mask, or in response to another STI or field oxide insulator.

The present inventors have observed various drawbacks associated with prior art transistor 10, and those drawbacks should be more readily appreciated in view of the preceding discussion of FIGS. 1a through 1c. Specifically, as introduced above, the prior art transistor is subject to various misalignments, and any of these misalignments may undesirably affect the predictability of the device's operation and its uniformity relative to other like transistors formed at the same time with respect to substrate 20. Indeed, there are many different possible misalignments. For instance, recalling that p-well 26 is aligned by a photolithographic process, then it may be formed such that its right edge as shown in FIG. 1a is shifted to the left, thereby presenting a gap between it and the left edge of n-well 24. Similarly, since n-well 24 is also aligned by a photolithographic process, then it may be formed such that its left edge as shown in FIG. 1a is shifted to the right, presenting a gap between it and the right edge of p-well 26. In either case, the goal of a common interface 28 is not achieved, and this may affect the behavior of operation along channel 36. As a result, although the edge of source 34, under gate conductor 32 is self-aligned and, thus, relatively well-controlled, a shift in the edge of either p-well 26 or n-well 24 under gate conductor 32 may affect the length of channel 36 and, therefore, may undesirably affect the predicted operation of the device. As a final example, wells 24 and 26 may overlie one another more extensively than intended along interface 28 such that the dopants from the second-formed of the two wells are more heavily infused into the first-formed of the two wells. From the preceding, it may be appreciated that the channel length is susceptible to a compound alignment since gate conductor 32 and the well boundaries are all photolithographically aligned. Hence, a minimum channel length, which is often highly desired, is limited by photolithographic process variations.

Figure 2A:
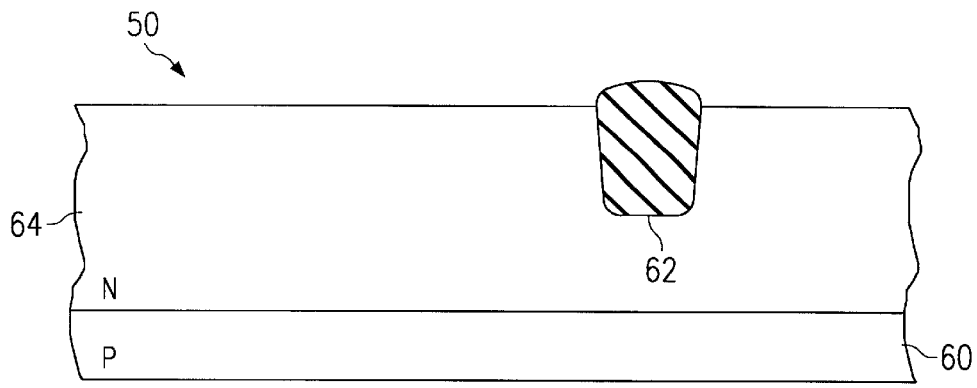
FIG. 2a illustrates a cross-sectional view of a preferred embodiment DEMOS transistor after some preliminary construction steps.

FIG. 2a illustrates a cross-sectional view of a preferred embodiment DEMOS transistor 50 after some preliminary construction steps. Transistor 50 is constructed relative to a substrate 60 which, in the present example and the preferred embodiment, is a p-type semiconductor substrate and is preferably part of an integrated circuit. An STI region 62 is formed first in substrate 60, and like the prior art it defines an adjacent area generally referred to as the active area, that is, the area in which the transistor source/drain regions will be formed. However, as further appreciated below, the alignment of various regions in the preferred embodiment are not relative to STI region 62 as they are in the prior art. STI region 62 is formed by first forming a pit or void within the upper surface of substrate 60 and then filling the pit with an insulator and planarizing the insulator to leave the remaining insulator portion shown in FIG. 2a as STI region 62. After STI region 62 is formed, a well 64 is formed in substrate 60, and in the preferred embodiment well 64 is formed using n-type dopants to thereby create an n-well 64. Note that n-well 64 extends laterally across the entire span of FIG. 2a and, thus, it is not tightly constrained relative to STI region 22; however, its outer edges (not shown) may be photographically aligned with respect to STI region 22, but those edges are of lesser consequence because they do not lie proximate the gate conductor which is formed later. Alternatively these outer areas may be self-aligned relative to other STI or field oxide regions. In any event, n-well 64 preferably is formed by masking the surface of substrate 60 and then implanting dopants through any open area of the mask.

Figure 2B:
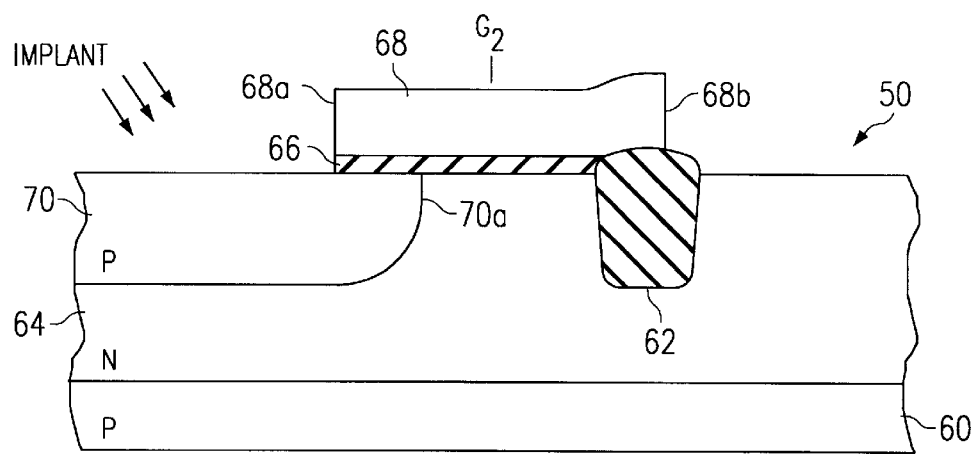
FIG. 2b illustrates a cross-sectional view of the inventive DEMOS transistor from FIG. 2a after additional construction steps.

FIG. 2b illustrates a cross-sectional view of DEMOS transistor 50 from FIG. 2a after additional construction steps. A gate dielectric 66 is formed over substrate 60, and it may be an oxide, a thermally grown silicon dioxide, a nitride, an oxynitride, or a combination of these or other insulators. A gate conductor 68 is formed over gate dielectric 66 and is patterned to extend partially over STI region 62, such as by forming a layer of conductive material which is patterned and etched to form gate conductor 68. Further, gate conductor 68 may be formed from polysilicon, although other materials may be used. After gate conductor 68 is formed, an angular implant is performed in the area shown in FIG. 2b to the left of gate conductor 68 and for the purpose of forming a p-well 70, that is, to form a well of opposite conductivity type relative to well 64 (which is n-type). Further in this regard, note that such an angular implant has been used in the art of formation of other semiconductor devices, but typically it is used to form a second region of a same conductivity type as the first region within which the second region is formed (e.g., a p-region in a p-well or an n-region in an n-well). In such devices, the angular implant is sometimes referred to as a halo implant or a pocket implant. In any event, due to the angular nature of the implant, part of p-well 70 extends laterally underneath gate conductor 68 to a greater extent than if a standard vertical implant were used, and in the preferred embodiment a subsequent anneal is performed which may cause the p-type dopants to encroach laterally even more so under gate conductor 68. As is important for reasons detailed later, note that the formation of p-well 70 defines an edge 70a underneath gate conductor 68, and edge 70a is self-aligned to edge 68a of gate conductor 68. In other words, the location of edge 70a occurs due to the masking effect of a physical device structure, namely, gate conductor 68 rather than from a photolithographically imposed edge such as from a photolithographic mask.

Figure 2C:
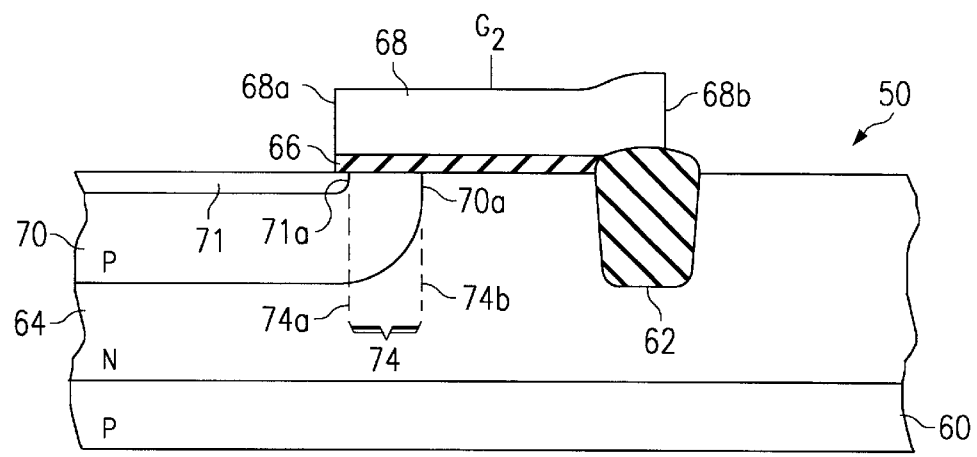
FIG. 2c illustrates a cross-sectional view of the inventive DEMOS transistor from FIG. 2b after additional construction steps.

FIG. 2c illustrates a cross-sectional view of DEMOS transistor 50 from FIG. 2b after an additional construction step. An n-type region 71 is formed preferably using a standard implant followed by an annealing step, with region 71 being formed in p-well 70 and preferably using a relatively light doping concentration as compared to higher-doped n-type regions formed below in connection with FIG. 2d. In one embodiment, region 71 may be formed using the same mask as is used to form p-well 70, but using a lower energy than used for p-well 70 and also using a vertical implant, whereby the combination of these factors yields a depth of penetration of the dopants that is less than that of well 70 as shown. Additionally, for the formation of region 71, there may not be a need for a separate mask for that lightly doped region since, like p-well 70, region 71 also self-aligns to edge 68a of gate conductor 68. As an alternative embodiment, however, a separate mask may be used. Further, typically the annealing step used in the formation of region 71 causes it to diffuse slightly under gate conductor 68 and gate dielectric 66. As further detailed below, region 71 forms part of the source for transistor 50, whereas n-well 64 acts in part as the drain of transistor 50. As a result, a transistor channel 74 is defined under gate conductor 68 and extending between the interface between edge 70a and n-well 64 and the right edge 71a of region 71.

Figure 2D:
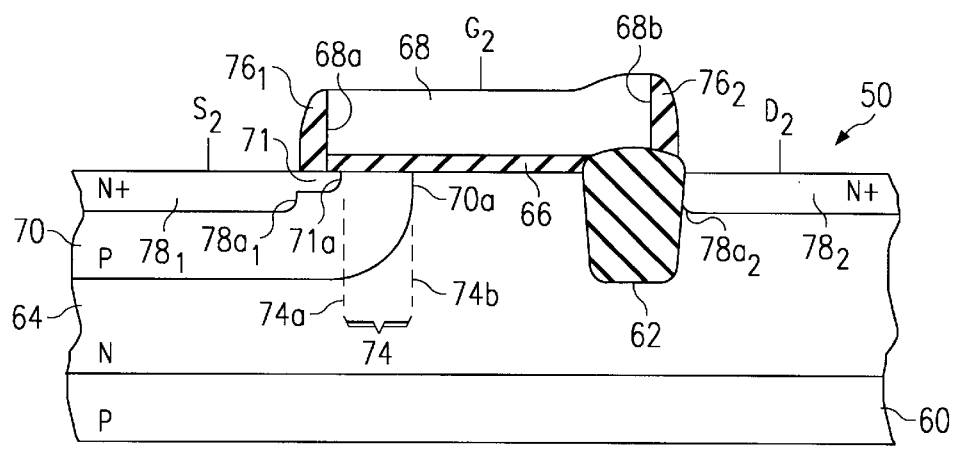
FIG. 2d illustrates a cross-sectional view of the inventive DEMOS transistor from FIG. 2c after additional construction steps.

FIG. 2d illustrates a cross-sectional view of DEMOS transistor 50 from FIG. 2c after additional construction steps. Sidewall insulators $76_1$ and $76_2$ are formed along edges 68a and 68b, respectively, of conductor 68, such as by forming an insulator layer over the entire structure and etching it appropriately. Thereafter, two doped regions $78_1$ and $78_2$ are formed at the same time and preferably using a standard implant followed by an annealing step, with region $78_1$ being formed in p-well 70 and acting in combination with region 71 as the source $S_2$ while region $78_2$ is formed in n-well 64 and acts in part as the drain $D_2$. In the preferred embodiment, regions $78_1$ and $78_2$ are n-type regions with relatively high doping concentrations (e.g., relative to n-well 64 and region 71) and are, therefore, labeled in FIG. 2d with an N+ designation. Region $78_1$ has one edge $78a_1$ proximate and preferably slightly under sidewall insulator $76_1$ while its other edge extends away from gate conductor 68 (and is not shown, but would be to the left in FIG. 2d). Region $78_2$ has one edge $78a_2$ proximate and abutting STI region 62, while its other edge extends away from gate conductor 68 and STI region 62 (and is not shown, but would be to the right in FIG. 2d). Thus, in operation, when a large drain voltage is applied relative to gate conductor 68, then considerable voltage may be dropped across STI region 62 between gate conductor 68 and region $78_2$, thereby avoiding damage to gate dielectric 66. Further, n-type region $78_2$ functions only as part of the drain of transistor 50 in that the light conductivity type n-well 64 effectively extends the drain region under gate conductor 68. Accordingly, transistor channel 74 is defined under gate conductor 68 and extending between the interface between edge 70a and n-well 64 and the right edge 71a of lightly doped region 71.

Given the preceding, various observations may be made relative to the preferred embodiment such as with reference to FIG. 2d. As a first observation and with respect to regions 71 and $78_1$, note that each has an edge that is self-aligned with respect to gate conductor 68. With respect to region 71, its edge 71a, which is adjacent channel 74, is self-aligned with respect to edge 68a of gate conductor 68, meaning edge 68a creates a physical mask and, thus, a physical reference point relative to where edge of region 71a is formed in response to the dopant implant. With respect to region $78_1$, its edge $78a_1$ is self-aligned with respect to sidewall insulator $76_1$. Here, sidewall insulator $76_1$ creates the physical reference point relative to where edge $78a_1$ is formed in response to the dopant implant. Lastly, because sidewall insulator $76_1$ is fixed to gate conductor 68, then edge $78a_1$ is also therefore self-aligned relative to gate conductor 68. As a second observation, therefore, note that the lateral length of channel 74 is defined only by self-aligned features. More particularly, the left edge 74a of channel 74 is defined by the self-aligned right edge 71a of region 71, and the right edge 74b of channel 74 is defined by the self-aligned right edge 70a of p-well 70. Accordingly, both edges 74a and 74b of channel 74 are self-aligned, and in the preferred embodiment they are self-aligned relative to edge 68a of gate conductor 68. As a result, the length of channel 74 is more predictable as compared to a device, such as transistor 10 of the prior art, wherein at least one or both edges of the channel are photolithographically defined as opposed to self-aligned. This improvement in channel length predictability gives rise to greater uniformity for various transistors formed in a mutual substrate using the same design as transistor 50, and when implemented as a DEMOS transistor there is the added advantage of improved device reliability. As still another benefit, the length of channel 74 is determined primarily by the angular implant used to form p-well 70 and, thus, by controlling the angular implant a considerably small channel may be achieved, and such a small channel may be highly desirable in various instances.

The preceding has demonstrated various benefits of the preferred embodiment, many of which arise in connection with the formation of p-well 70 using an angular implant. Further in this regard, note that various alternatives are also contemplated within the present inventive teachings as relating to that angular implant. As a first embodiment for the p-well 70 formation step, note that transistor 50 may be constructed relative to substrate 60 at the same time that other devices are being formed relative to that same substrate. Further, some of those other devices may use an angular implant for other reasons, such as forming a second region within a previously-formed region, where both regions have the same conductivity type as mentioned earlier. Given this possibility, in one approach the formation of p-well 70 may occur during the same step of using the angular implant for other reasons, that is, the same energy level and dopant concentration used for the other devices may be used to form p-well 70. In such an approach, no additional fabrication steps are required to construct transistor 50 that were not already required to construct other devices relative to substrate 60. As a second embodiment for the p-well 70 formation, however, a separate angular implant, with a different energy and/or dopant concentration, may be used solely to create p-well 70 (and any other comparable wells for other transistors like transistor 50 then being formed in substrate 60). This latter approach increases the number of fabrication steps, but it also gives added flexibility in the formation of p-well 70 and likewise in the design flexibility for channel 74.

Still another benefit of the preferred embodiment arises when transistor 50 is implemented as an input/output transistor on a circuit having different transistor characteristics for its input/output transistors versus its core transistors, as is commonly the case in contemporary circuits where, by way of example, the core transistors may operate at a lesser voltage than the input/output transistors such as discussed in the Background Of The Invention section of this document. In such an embodiment, the core transistors typically include source/drain regions that use two implants, a first for forming an LDD portion extending under the transistor gate, and a second implant forming the remainder of the source/drain region extending away from the transistor channel. In connection with transistor 50 and as introduced above, the same implant step used to form the n-type LDD portions for the core transistors also may be used to form n-type LDD region 71 of transistor 50 in the input/output circuit. Thus, there is no need for an additional and different implant step to form n-type LDD region 71 beyond that already provided for in constructing the core transistors. In addition, no LDD region need be formed in connection with drain $D_2$ of transistor 50, because the effective lighter doping of drain $D_2$ is achieved in connection with n-well 64, and that well may be created at the same time as are other n-wells that will be required to construct p-type devices in a CMOS architecture. As a result, this elimination of additional patterning and related steps may produce a valuable cost savings for a process flow used for dual voltage integrated circuits.

Figure 3:
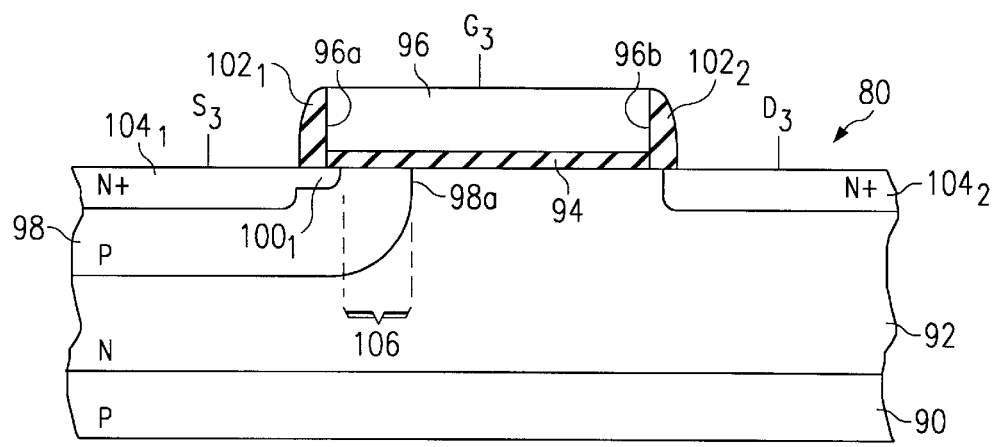
FIG. 3 illustrates a cross-sectional view of an alternative preferred embodiment transistor.

Yet another alternative in the preferred embodiment is shown in FIG. 3, which illustrates a cross-sectional view of an alternative preferred embodiment transistor designated generally at 80. Transistor 80 shares many attributes that are comparable to transistor 50 described above and, thus, these attributes are not discussed in significant detail. Looking briefly to these comparable attributes, transistor 80 is constructed relative to a substrate 90, which preferably is a p-type semiconductor substrate. An n-well 92 is formed in substrate 90, and a gate dielectric 94 is formed over substrate 90 and, hence, over n-well 92. Next, a gate conductor 96 is formed over gate dielectric 94, preferably from polysilicon or other suitable materials. After gate conductor 96 is formed, an angular implant is performed in the area shown in FIG. 3 to the left of gate conductor 96 and for the purpose of forming a p-well 98, thereby forming a well of opposite conductivity type relative to well 92 (which is n-type). Due to the angular nature of the implant, part of p-well 98 extends laterally underneath gate conductor 96 to a greater extent than if a standard vertical implant were used, and in the preferred embodiment a subsequent anneal is performed which may cause the p-type dopants to encroach laterally even more so under gate conductor 96. The formation of p-well 98 defines an edge 98a underneath gate conductor 96, and edge 98a is self-aligned to edge 96a of gate conductor 96.

After gate conductor 96 and p-well 98 are formed, a lightly doped region 100, is formed self-aligned to edge 96a of gate conductor 96 and within p-well 98. Preferably, region $100_1$ is formed using a standard vertical implant with a relatively light doping concentration and followed by an annealing step which causes both regions to diffuse slightly under gate conductor 96 and gate dielectric 94. In one embodiment, region $100_1$ may be formed using the same mask as is used to form p-well 98, but using a lower energy and vertical implant so that the depth of penetration of the dopants is less than that of well 98 as shown. Additionally, for the formation of region $100_1$, there may not be a need for a separate mask for that lightly doped region since, like p-well 98, region $100_1$ also self-aligns to edge 96a of gate conductor 96. As an alternative embodiment, however, a separate mask may be used. In any event, after the formation of region $100_1$, sidewall insulators $102_1$ and $102_2$ are formed along edges 96a and 96b, respectively, of gate conductor 96. Following that step, two symmetric doped regions $104_1$ and $104_2$ are formed at the same time and preferably using a standard implant followed by an annealing step, with region $104_1$ being formed in p-well 98 and acting in combination with region $100_1$ as the source $S_3$ while region $104_2$ is formed in n-well 92 and acts in part as the drain $D_3$. Preferably, regions $104_1$ and $104_2$ are n-type regions with relatively high doping concentrations (e.g., relative to n-well 92 and regions $100_1$ and $100_2$) and are, therefore, labeled in FIG. 3 with an N+ designation.

Having detailed the various components of transistor 80, note that its source $S_3$, as comprising region $104_1$ and region $100_1$, is self-aligned with respect to gate conductor 96. Specifically, region $100_1$ is adjacent a channel 106 and is self-aligned with respect to edge 96a of gate conductor 96, while region $104_1$ is self-aligned with respect to sidewall insulator $102_1$ and, hence, also with respect to gate conductor 96. Moreover, edge 98a of p-well 98 is self-aligned relative to gate conductor 96 for the same reasons as discussed above relative to p-well 70 of transistor 50. Thus, the length of channel 106 is well-controlled because both of its lateral boundaries, shown vertically in FIG. 3, are self-aligned boundaries. As a result, the length of channel 106 is more predictable as compared to a prior art device such as transistor 10 of the prior art and, hence, device reliability and operability in the preferred embodiment are improved.

From the above, it may be appreciated that the above embodiments provide an improved transistor with a self-aligned channel implant and gives rise to numerous improvements over the prior art. Further, while various alternatives have been provided above, others are contemplated within the inventive scope. For example, other components may be added to transistor 50 in addition to those shown in FIG. 2d or to transistor 80 shown in FIG. 3. As another example, while one preferred transistor is illustrated as a particular configuration of a DEMOS transistor, other DEMOS transistors or indeed, transistors other than DEMOS transistors, also may benefit from the present inventive teachings. As yet another example, when the preferred embodiment is implemented as a DEMOS transistor, it may connected in various circuit configurations. For example, the preferred embodiment may prove quite useful for input/output connections, such as in an open drain/collector configuration. In one instance of such a configuration, the drain of transistor 50 may be physically isolated and connected directly to an integrated circuit bond pad. As still another example, while the preferred embodiment has been illustrated as an n-channel transistor, the present teachings may be used to form a comparable p-channel transistor by complementing various of the material conductivity types described above. Still further, additional alterations may be ascertained by one skilled in the art. Consequently, while the present embodiments have been described in detail, various substitutions, modifications or alterations could be made to the descriptions set forth above without departing from the inventive scope which is defined by the following claims.

What is claimed is:

1. A method of forming an integrated circuit, comprising the steps of:

forming a gate insulator;

forming a gate conductor relative to the gate insulator such that the gate insulator separates the gate conductor from a semiconductor material having a first conductivity type;

forming a drain region having the first conductivity type;

performing an angular implant to form an angular implanted region having a second conductivity type complementary of the first conductivity type and having an angular implanted region edge underlying the gate conductor;

forming a source region formed within the angular implanted region; and wherein the steps of performing an angular implant and forming a source region define a transistor channel between an edge of the source region proximate the gate conductor and the angular implanted region edge underlying the gate conductor.

2. The method of claim 1 wherein the edge of the source region proximate the gate conductor is self-aligned with respect to the gate conductor.

3. The method of claim 2 wherein the angular implanted region edge underlying the gate conductor is self-aligned with respect to the gate conductor.

4. The method of claim 3 wherein the semiconductor material having a first conductivity type comprises a semiconductor material having an n-type.

5. The method of claim 4 wherein the semiconductor material comprises an n-well formed in a p-type semiconductor substrate.

6. The method of claim 5 and further comprising:

forming a gate insulator separating at least a portion of the gate conductor from the semiconductor material; and forming an insulating region proximate one edge of the gate conductor;

and wherein the drain region has a first edge abutting the insulating region and a second edge extending away from the insulating region and the gate conductor.

7. The method of claim 6 wherein the drain region has a higher dopant concentration than the semiconductor material.

* * * * *